(12) United States Patent
Agam et al.

(10) Patent No.: US 11,251,263 B2
(45) Date of Patent: Feb. 15, 2022

(54) ELECTRONIC DEVICE INCLUDING A SEMICONDUCTOR BODY OR AN ISOLATION STRUCTURE WITHIN A TRENCH

(71) Applicant: Semiconductor Components Industries, LLC, Phoenix, AZ (US)

(72) Inventors: Moshe Agam, Portland, OR (US); Jaroslav Pjenčák, Dolní Bečva (CZ); Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 20 days.

(21) Appl. No.: 16/515,243

(22) Filed: Jul. 18, 2019

(65) Prior Publication Data

US 2020/0295126 A1     Sep. 17, 2020

Related U.S. Application Data

(60) Provisional application No. 62/817,903, filed on Mar. 13, 2019.

(51) Int. Cl.
    *H01L 29/04*      (2006.01)
    *H01L 27/06*      (2006.01)
    (Continued)

(52) U.S. Cl.
    CPC ............ *H01L 29/04* (2013.01); *H01L 27/016* (2013.01); *H01L 27/0629* (2013.01);
    (Continued)

(58) Field of Classification Search
None
See application file for complete search history.

(56) References Cited

U.S. PATENT DOCUMENTS 4,754,310 A * 6/1988 Coe .................... H01L 29/0634
    257/287
5,352,923 A * 10/1994 Boyd ..................... H01L 28/20
    257/379

(Continued)

OTHER PUBLICATIONS

Bob Street; "Flat Panel X-ray Image Sensors"; Palo Alto Research Center; https://slideplayer.com/slide/13057876/79/images/12/, including slide 12; pp. 1-17; listed as modified over three years ago (exact date unknown).

(Continued)

*Primary Examiner* — Grant S Withers
(74) *Attorney, Agent, or Firm* — Abel Schillinger, LLP

(57) ABSTRACT

An electronic device can include a substrate defining a trench. In an embodiment, a semiconductor body can be within the trench, wherein the semiconductor body has a resistivity of at least 0.05 ohm-cm and is electrically isolated from the substrate. In an embodiment, an electronic component can be within the semiconductor body. The electronic component can be a resistor or a diode. In a particular embodiment, the semiconductor body has an upper surface, the electronic component is within and along an upper surface and spaced apart from a bottom of the semiconductor body. In a further embodiment, the electronic device can further include a first electronic component within an active region of the substrate, an isolation structure within the trench, and a second electronic component within the isolation structure.

20 Claims, 12 Drawing Sheets

(51) Int. Cl.
  *H01L 29/861* (2006.01)
  *H01L 29/8605* (2006.01)
  *H01L 29/78* (2006.01)
  *H01L 27/01* (2006.01)
  *H01L 29/73* (2006.01)
  *H01L 29/739* (2006.01)

(52) U.S. Cl.
  CPC .......... *H01L 27/0647* (2013.01); *H01L 29/73* (2013.01); *H01L 29/7393* (2013.01); *H01L 29/78* (2013.01); *H01L 29/861* (2013.01); *H01L 29/8605* (2013.01)

(56) References Cited

U.S. PATENT DOCUMENTS

| | | | | |
|---|---|---|---|---|
| 7,132,712 | B2* | 11/2006 | Kocon | H01L 29/404 257/328 |
| 10,510,747 | B1* | 12/2019 | Qiao | H01L 29/0878 |
| 2006/0097349 | A1 | 5/2006 | Shaw et al. | |
| 2006/0255401 | A1* | 11/2006 | Yang | H01L 29/7803 257/328 |
| 2007/0145411 | A1 | 6/2007 | Chen et al. | |
| 2008/0124889 | A1 | 5/2008 | Roggenbauer et al. | |
| 2009/0212354 | A1 | 8/2009 | Hsieh | |
| 2009/0267186 | A1* | 10/2009 | Cheng | H01L 29/66181 257/533 |
| 2010/0078645 | A1* | 4/2010 | Kurz | H01L 21/84 257/66 |
| 2010/0078727 | A1* | 4/2010 | Min | H01L 21/84 257/369 |
| 2010/0308397 | A1* | 12/2010 | Ariyoshi | H01L 28/20 257/324 |
| 2011/0068371 | A1* | 3/2011 | Oka | H01L 29/861 257/194 |
| 2012/0205776 | A1 | 8/2012 | Kemerer et al. | |
| 2013/0032893 | A1* | 2/2013 | Pal | H01L 23/485 257/379 |
| 2013/0075809 | A1 | 3/2013 | Hsieh | |
| 2014/0183657 | A1 | 7/2014 | Lim et al. | |

OTHER PUBLICATIONS

"Si-Silicon Electrical Properties"; https://web.archive.org/web/20170707065020/http://www.ioffe.ru/SVA/NSM/Semicond/Si/electric.html; pp. 1 to 6 (Jul. 7, 2017, capture date).

Then et al.; "Advances in Research on 300mm Gallium Nitride-on-Si(111) NMOS Transistor and Silicon CMOS Integration"; Institute of Electrical and Electronics Engineers; IEDM20-581-84.

Cho, Nam Inh;"SIMOX SOI"; ETRI Journal; vol. 5, No. 1; Electronics and Telecommunications Research Institute; pp. 55-70 (1990).

Orouji, Ali A.;Leakage Current Reduction Techniques in Poly-Si TFTs for Active Matrix Liquid Crystal Displays: A Comprehensive Study; IEEE Trans. on Device and Materials Reliability, vol. 6; pp. 315-325 (2006).

Wolf, Stanley and Tauber, Richard N.; Silicon Processing for the VLSI Era, vol. 1: Process Technology; Lattice Press pp. 303, 305 (1986).

William Strunk, Jr. & E.B. White, The Elements of Style, Allyn & Bacon; p. 23 (4th ed. 2000).

* cited by examiner

ELECTRONIC DEVICE INCLUDING A SEMICONDUCTOR BODY OR AN ISOLATION STRUCTURE WITHIN A TRENCH

CROSS REFERENCE TO RELATED APPLICATION

This application claims priority under 35 U.S.C. § 119(e) to U.S. Patent Application No. 62/817,903 entitled "Electronic Device Including a Semiconductor Body or an Isolation Structure Within a Trench," by Agam et al., filed Mar. 13, 2019, which is assigned to the current assignee hereof and incorporated herein by reference in its entirety.

FIELD OF THE DISCLOSURE

The present disclosure relates to electronic devices and processes of forming electronic devices, and more particularly to, electronic devices including semiconductor bodies or isolation structures within trenches and processes of forming the same.

RELATED ART

A semiconductor die may include different components where one component may interfere with the operation of another. For example, a power transistor may be isolated from a logic transistor, so that the electrical fields of the power transistor do not adversely affect the operation of the logic transistor. Deep trench isolation can be used to electrically isolate the power transistor from the logic transistor; however, the deep trench isolation occupies area of the die that is only used for electrical isolation. Improvements in semiconductor die and more efficient use of area of the die are desired.

BRIEF DESCRIPTION OF THE DRAWINGS

Embodiments are illustrated by way of example and are not limited in the accompanying figures.

Figure 1:
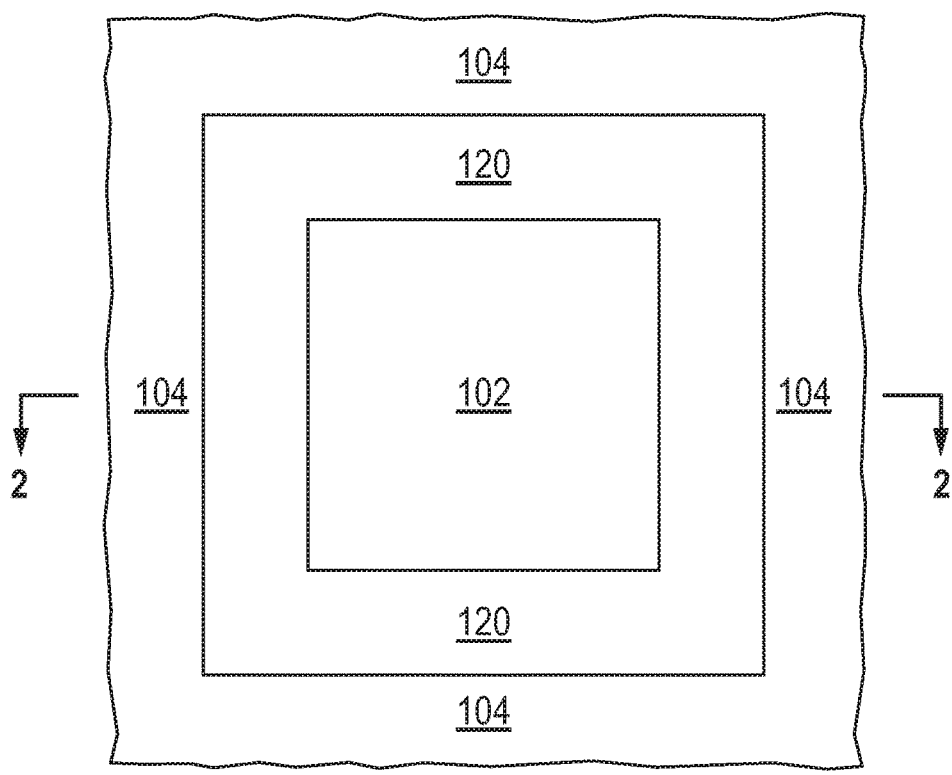
FIGS. 1 and 2 include illustrations of top and cross-sectional views of a portion of a workpiece including a substrate and a trench extending into the substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "deep trench isolation" is intended to mean an isolation structure having a depth of at least 5 microns. Shallow trench isolation is shallower than deep trench isolation and normally has a depth less than 1 micron.

The term "logic transistor" is intended to mean a transistor that can flow at most 0.1 ampere of current between the transistor's drain and source ($I_{DS}$) or collector and emitter ($I_{CE}$) when in the on-state, and can withstand a voltage of at most 10 volts between the transistor's drain and source ($V_{DS}$) or collector and emitter ($V_{CE}$) when in the off-state.

The term "power transistor" is intended to mean a transistor that can flow more than 1 ampere of current between the transistor's drain and source ($I_{DS}$) or collector and emitter ($I_{CE}$) when in the on-state, and can withstand a voltage of at least 30 volts between the transistor's drain and source ($V_{DS}$) or collector and emitter ($V_{CE}$) when in the off-state.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A resistor or a diode can be formed within a portion of an electronic device that may otherwise be unused. In an embodiment, the electronic device can include a trench isolation structure that can include a semiconductor body within the trench. In a particular embodiment, the trench isolation structure can be a deep trench isolation structure. The resistor or diode can be within the semiconductor body, and in an embodiment, can be along an upper surface of the semiconductor body that lies along a plane substantially parallel to a primary surface of the substrate. Active regions of the substrate may lie along opposite sides of the trench isolation structure. One or more resistors, diodes or a resistor-diode combination can be within the semiconductor body and coupled to one or more electronic components within either or both of the active regions.

In an aspect, an electronic device can include a substrate defining trench having a depth of at least 5 microns; a semiconductor body within the trench, wherein the semiconductor body has an upper surface and a resistivity of at least 0.05 ohm-cm and is electrically isolated from the substrate; and an electronic component within and along an upper surface and spaced apart from a bottom of the semiconductor body.

In another aspect, an electronic device can include a substrate defining a trench; a semiconductor body within the trench, wherein the semiconductor body has a resistivity of at least 0.05 ohm-cm and is electrically isolated from the substrate; and a diode within the semiconductor body.

In a further aspect, an electronic device can include a substrate defining a trench; a first electronic component within an active region of the substrate; an isolation structure within the trench and surrounding the first electronic component; and a second electronic component within the isolation structure. The concepts are better understood after reading the remainder of the specification in conjunction with the figures.

Figure 2:
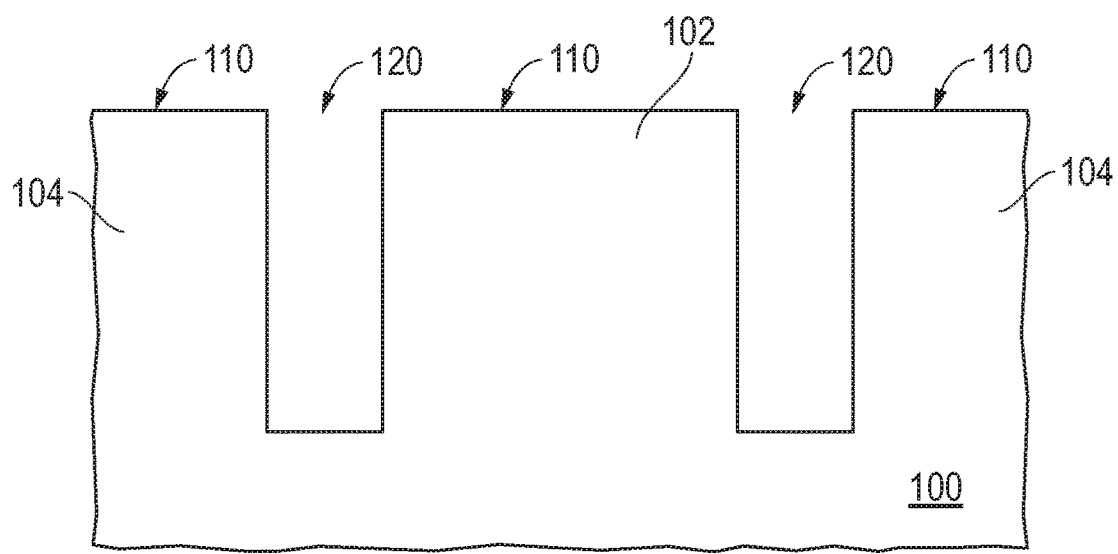

FIGS. 1 and 2 include top and cross-sectional views of a substrate 100 after patterning the substrate 100 to define a trench 120. FIG. 2 is along a sectioning line 2-2 in FIG. 1. The substrate 100 has a primary surface 110 and can include a monocrystalline semiconductor material that can include a Group 14 element, such as Si or Ge, or a compound semiconductor material, such as SiC, SiGe, a III-V semiconductor, such as GaAs, GaN, AlGaN, InP, or the like, or a II-VI semiconductor, such as CdSe, PbTe, or the like. The substrate 100 have a relatively simple construction, such as a Si wafer with a substantially uniform dopant concentration, or may have a more complicated structure that may include a buried doped layer, an undoped or lightly doped epitaxial layer over a heavily doped wafer, a buried oxide layer, another suitable construction, or a combination thereof.

The trench 120 can be used for a deep trench isolation structure that separates an active region 102 from another active region 104. For more complex substrate constructions, the trench 120 may extend to or through a buried feature, such as a buried doped region, a buried oxide layer, or the like. The depth of the trench 120 may be at least 5 microns, at least 11 microns, or at least 20 microns. The trench 120 does not extend through an entire thickness of the substrate 100. In an embodiment, the trench 120 has a depth of at most 95 microns, at most 75 microns, or at most 50 microns. The width of the trench 120 is sufficient to provide electrical isolation between electronic components that may be formed at least partly within the substrate along the primary surface 110. While there is no theoretical limit on the width of the trench 120, as the width becomes larger, more active area is lost and limits area for electronic components. In an embodiment, the width of the trench is at least 0.2 micron, at least 0.3 micron, or at least 0.5 micron, and in another embodiment, the width is at most 9.5 microns, at most 4 microns, or at most 2 microns.

Figure 3:
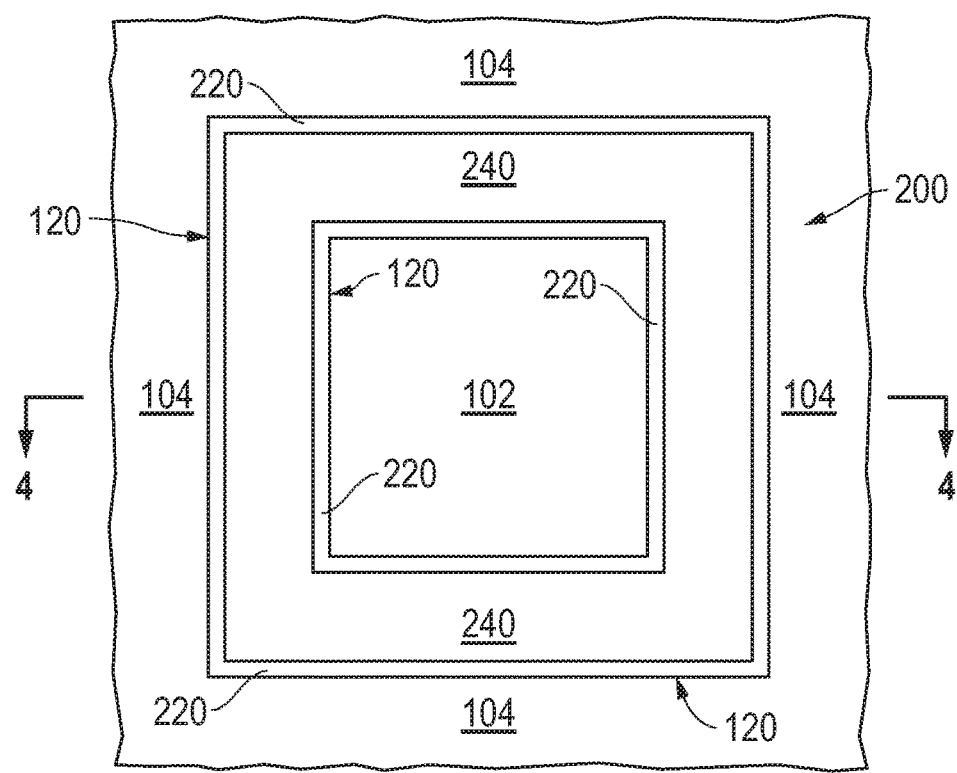
FIGS. 3 and 4 include illustrations of top and cross-sectional views of the workpiece of FIGS. 1 and 2 including an insulating layer and a semiconductor body within the trench.
Figure 4:
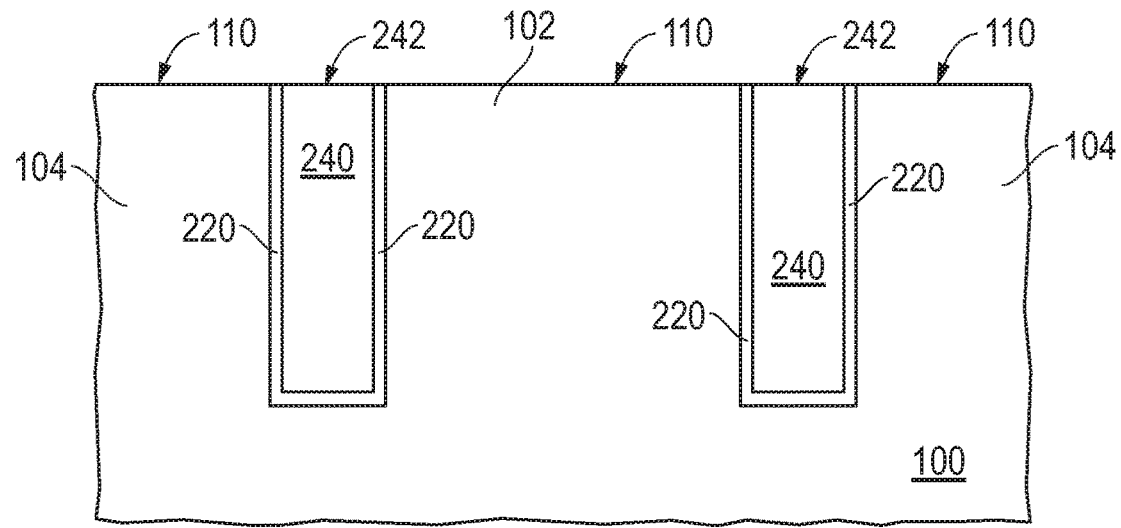

FIGS. 3 and 4 illustrate top and cross-sectional views of the workpiece after forming an insulating layer 220 and filling a remaining portion of the trench 120 with a semiconductor body 240 having an upper surface 242. FIG. 4 is along a sectioning line 4-4 in FIG. 3. The insulating layer 220 can include an oxide, a nitride, or an oxynitride. The insulating layer 220 can be formed by thermally oxidizing the substrate 100 to form the insulating layer 220 or by depositing the insulating layer 220. The insulating layer 220 is deposited to a thickness sufficient to be continuous along the sidewalls and bottom of the trench 120 and not so thick as to completely fill the trench 120. When expressed as a percentage of the width of the trench 120, the insulating layer can have a thickness in a range of 0.2% to 20% of the width of the trench 120. In an embodiment, the insulating layer has a thickness of at least 20 nm, at least 50 nm, or at least 110 nm, and in another embodiment, the thickness is at most 900 nm, at most 500 nm, or at most 200 nm.

The semiconductor body 240 can help to reduce stress as the workpiece is processed through one or more high temperature operations (for example, greater than 600° C.). In an embodiment, the semiconductor body 240 and the substrate 100 can include the same material, for example, Si, so that the semiconductor body 240 and the substrate 100 have approximately the same coefficient of thermal expansion. As originally formed (before a selective doping operation), in an embodiment, the semiconductor body 240 has a high resistivity that is at least 0.05 ohm-cm, at least 2 ohm-cm, or at least 20 ohm-cm. In another embodiment, the semiconductor body 240 has a resistivity of at most 100 Mohm-cm. In terms of dopant concentration, the semiconductor body 240 can be deposited as an undoped semiconductor layer. In another embodiment, the semiconductor body 240 may be n-type or p-type and have a dopant concentration of at most $1\times10^{17}$ atoms/cm$^3$, at most $1\times10^{15}$ atoms/cm$^3$, or at most $1\times10^{14}$ atoms/cm$^3$. The dopant concentration of the semiconductor body 240 as originally formed, whether undoped or doped, is referred to herein as the background dopant concentration.

After forming the insulating layer 220 and depositing a layer of semiconductor material for the semiconductor body 240, portions of the insulating layer 220 and the semiconductor material outside the trench 120 are removed. An isolation structure 200 is within the trench 120, and in an embodiment, the isolation structure 200 is a deep isolation structure. The insulating layer 220 is disposed between the semiconductor body 240 and the sidewalls and bottom of the trench 120. The insulating layer 220 electrically isolates the semiconductor body 240 from the substrate 100. In the embodiment illustrated, the active region 102 of the substrate 100 is laterally surrounded by the isolation structure, and another active region 104 lies along the opposite side of the isolation structure 200. As will be described later in this specification, electronic components can be formed within the active regions 102 and 104 and the semiconductor body 240.

Exemplary electronic components that can be formed within the semiconductor body 240 can include at least one resistor, at least one diode, or a combination thereof. Thus, a more efficient use of space that would not otherwise be used can be realized. The electronic components lie along or near an upper surface of the of the semiconductor body 240. In an embodiment, the current flow through the electronic component can be principally along a direction substantially parallel to the upper surface 242 of the semiconductor body 240. The formation of the electronic components can be integrated into a process flow without adding any additional masking operations or other processing steps. Complicated vertical structures that can involve extra processing steps are not required.

Figure 5:
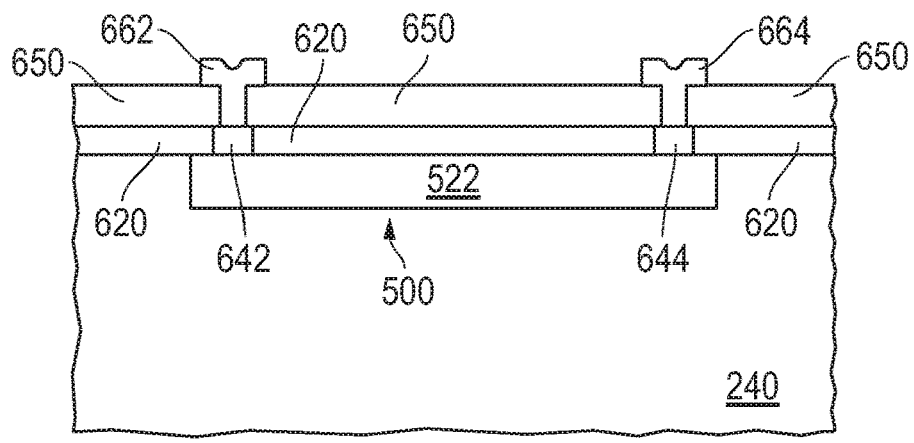
FIGS. 5 and 6 include illustrations of cross-sectional and top views of a portion the workpiece of FIGS. 3 and 4 after forming a resistor in accordance with an embodiment.
Figure 6:
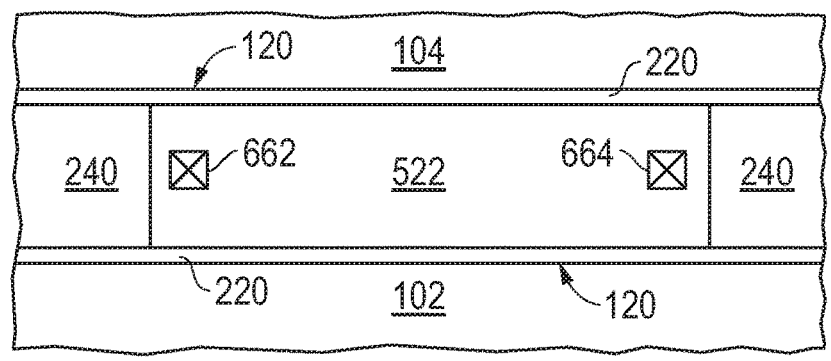

FIGS. 5 and 6 illustrate cross-sectional and top views of a resistor 500 that can be formed from the semiconductor body 240. In this embodiment, the resistor 500 is within the semiconductor body 240. The resistor 500 can be formed from a single doped region 522 has a dopant concentration higher than the dopant concentration of the semiconductor body 240. The resistance of the resistor 500 can be determined by the dopant concentration of the doped region 522, the distance between contacts to the doped region 522, and the width of the semiconductor body 520 (as seen from the top view). The doped region 522 can have a dopant concentration sufficient to allow for ohmic contacts to the doped region 522. In an embodiment, the doped region 522 can be formed at the same time as forming a source region, a drain region, or an emitter region of a transistor formed within an active region of the substrate 100. In an embodiment, the dopant concentration can be in a range of $1\times10^{18}$ atoms/cm$^3$ to $5\times10^{21}$ atoms/cm$^3$. The depth of the doped region 522 can be in a range of 0.02 microns to 0.5 microns. The depth can correspond to a pn junction depth of the doped region 522 or where the concentration of the doped region 522 is at least 10% higher than the background dopant concentration of the semiconductor body 240 when the semiconductor body 240 is undoped or has the same conductivity type as the doped region 522.

A salicide blocking layer 620 is formed over the workpiece and openings are formed where contacts are to be made to the doped region 522. The salicide blocking layer 620 can include one or more films of an oxide, a nitride, or an oxynitride. The thickness of the salicide blocking layer 620 can in a range of 10 nm to 200 nm. Salicide members 642 and 644 can be formed over the doped region 522. The salicide members 642 and 644 can include $TiSi_2$, $TaSi_2$, $CoSi_2$, $PtSi_2$, or the like. The salicide members 642 and 644 can have a thickness in a range of 10 nm to 200 nm.

An insulating layer 650 can be formed over the workpiece and patterned to define contact openings. The insulating layer 650 can include one or more films of an oxide, a nitride, or an oxynitride. The thickness of the insulating layer 650 can in a range of 0.1 micron to 5 microns. Interconnects 662 and 664 are formed within the contact openings and over the doped region 522. In an embodiment, the interconnects 662 and 664 can include a bulk conductive film that includes mostly Al or Cu. When the conductive layer includes a plurality of films, an adhesion film or a barrier film can be deposited before the bulk conductive film. An antireflective film can be formed over the bulk conductive film and can include a metal nitride film. The conductive layer can have a thickness in a range of 0.5 micron to 3 microns. The conductive layer can be patterned to form the interconnects 662 and 664. In another embodiment, the salicide members 642 and 644 may be part of the interconnects 662 and 664. In a further embodiment, the salicide members 642 and 644 may not be formed, and the interconnects 662 and 664 may make direct contact to the doped region 522. In an embodiment, the formation of the salicide blocking layer 620, salicide members 642 and 644, insulating layer 650, and interconnects 662 and 664 may be integrated with forming corresponding structures for other electronic components within one or more active regions of the substrate 100.

In FIG. 6 and other top views described later in this specification, the salicide blocking layer 620 and the insulating layer 650 are not illustrated to illustrate better the positional relationships between different parts of the electronic device. In practice, the salicide blocking layer 620 covers at least portions of the semiconductor body 240 and active regions 102 and 104 where a salicide member is not to be formed. The insulating layer 650 overlies all of the workpiece except for the contact openings and portions of scribe lanes.

Figure 7:
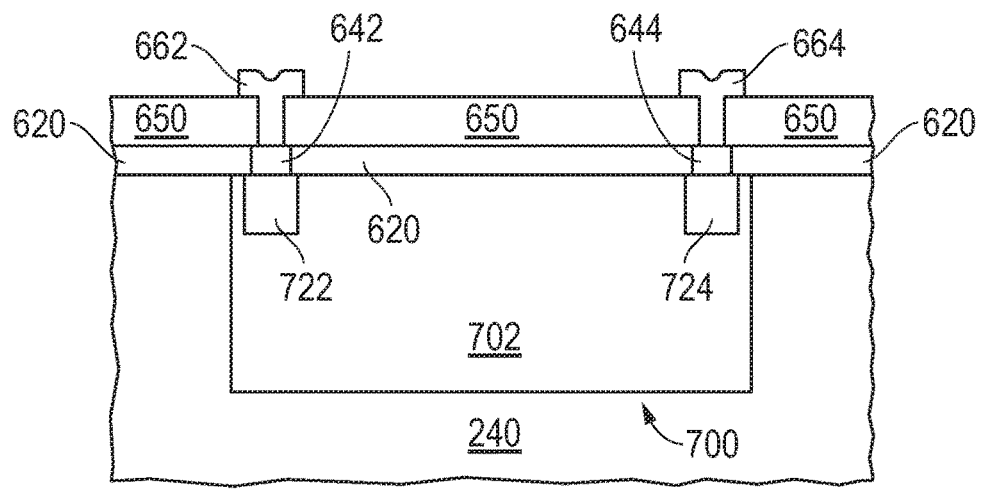
FIGS. 7 and 8 include illustrations of cross-sectional and top views of a portion the workpiece of FIGS. 3 and 4 after forming a resistor in accordance with another embodiment.
Figure 8:
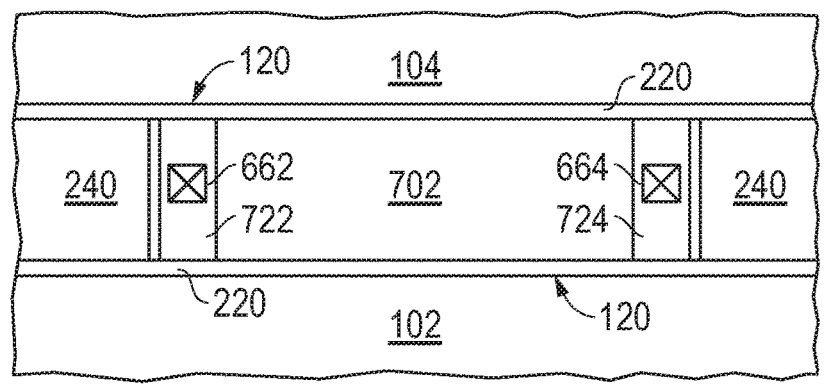

FIGS. 7 and 8 illustrate cross-sectional and top views of a resistor 700 that can be formed within the semiconductor body 240. The resistor 700 is similar to the resistor 500 except that the resistor 700 includes a well region 702 and doped regions 722 and 724. The well region 702 can allow for more control over the resistance of the resistor 700, as compared to the resistor 500 that depends on the dopant concentration of the doped region 522. Thus, the well region 702 allows the resistor 700 to achieve a resistance that may not be possible for the resistor 500 due to the dopant concentration of the doped region 522 and physical constraints of the resistor 500. The well region 702 can have an n-type or a p-type conductivity type. In an embodiment, the well region 702 has a dopant concentration higher than a dopant concentration of the semiconductor body 240. When the resistor 700 has a relatively higher resistance, the dopant concentration of the well region 702 may be at most $1\times10^{17}$ atoms/cm$^3$, at most $1\times10^{16}$ atoms/cm$^3$, or at most $1\times10^{15}$ atoms/cm$^3$. In an embodiment, the dopant concentration is at least $1\times10^{13}$ atoms/cm$^3$. When the resistor 700 has a relatively lower resistance, the dopant concentration may be at least $2\times10^{17}$ atoms/cm$^3$, at least $1\times10^{18}$ atoms/cm$^3$ to, or at least $1\times10^{19}$ atoms/cm$^3$. The well region 702 can have a depth that is that same or deeper as compared to the doped regions 722 and 724. In an embodiment, the depth of the well region 702 is less than half of the depth of the trench 120; and is typically less than a quarter of the depth of the trench 120. In an embodiment, the depth of the well region 702 is at least 0.02 micron, at least 0.3 micron, or at least 0.5 micron, and in another embodiment, the well region 702 has a depth that is at most 9 microns, at most 6 microns, or at most 3 microns. The doped regions 722 and 724 can have any of the dopant concentrations and depths as previously described with respect to the doped region 522. The well region 702 can have a dopant concentration that is less than the dopant concentrations of the doped regions 722 and 724.

The timing for the formation of the well region 702 may depend on the desired dopant concentration and depth of the well region 702. The well region 702 can be formed without adding an additional masking operation or another processing step. When the well region 702 is to have a relatively lower dopant concentration and relatively deeper depth, the well region 702 can be formed at the same time as an n-well or p-well for a body region, a drift region, or a base region of a transistor formed within an active region of the substrate. When the well region 702 is to have a relatively lower dopant concentration and relatively shallower depth, the well region 702 can be formed at the same time as an enhancement or depletion region for a channel region of a transistor formed within an active region 102 of the substrate 100. When the well region 702 is to have a relatively higher dopant concentration and relatively shallower depth, the well region 702 can be formed at the same time as a lightly doped drain (LDD) region of a transistor formed within an active region 102 or 104 of the substrate 100. The timing for the formation of the doped regions 722 and 724 may be any of the timings as described with respect to the formation of the doped region 522.

Figure 9:
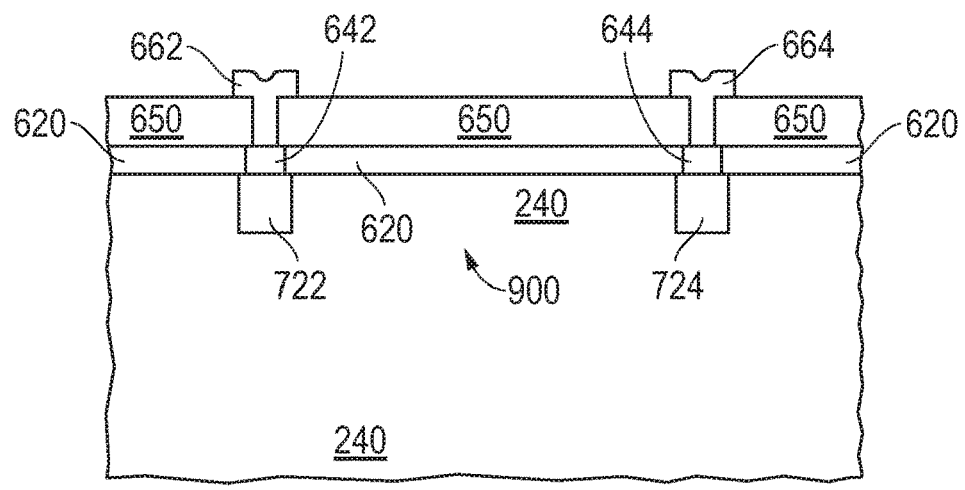
FIGS. 9 and 10 include illustrations of cross-sectional and top views of a portion the workpiece of FIGS. 3 and 4 after forming a resistor in accordance with a further embodiment.
Figure 10:
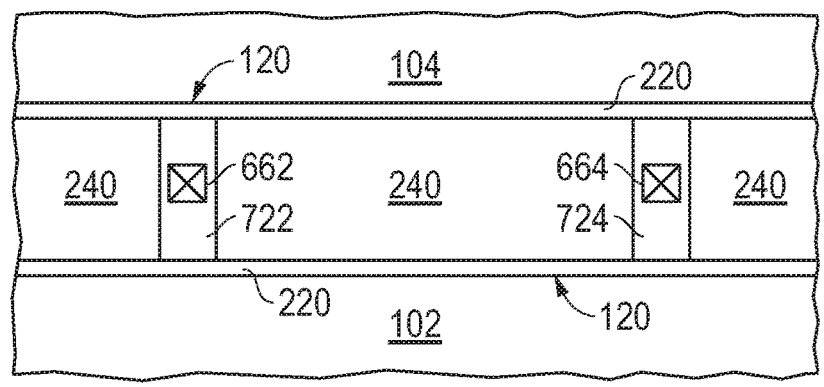

FIGS. 9 and 10 illustrate cross-sectional and top views of a resistor 900 that can be formed from the semiconductor body 240. In this embodiment, the resistor 900 is within the semiconductor body 240. Each of the doped regions 722 and 724 has a dopant concentration higher than the semiconductor body 240. A portion of the semiconductor body 240 is disposed between the doped regions 722 and 724. As compared to the embodiment as illustrated in FIGS. 7 and 8 that has a well region 702, the embodiment as illustrated in FIGS. 9 and 10 does not include a well region or other doped region between the doped regions 722 and 724. The resistance of the resistor 900 can be determined by the dopant concentration of the semiconductor body 240, the distance between and depths of the doped regions 722 and 724, and the width and the depth of the semiconductor body 240 (as seen from the top view). In the embodiment as illustrated, at least 50% of the current flow through the resistor 900 is at a depth of at most the depth of the doped regions 722 and 724. Significantly less than 50% of the current through the resistor 900 flows within the semiconductor body 240 at a depth more than 1 micron below the depths of the doped regions 722 and 724.

Figure 11:
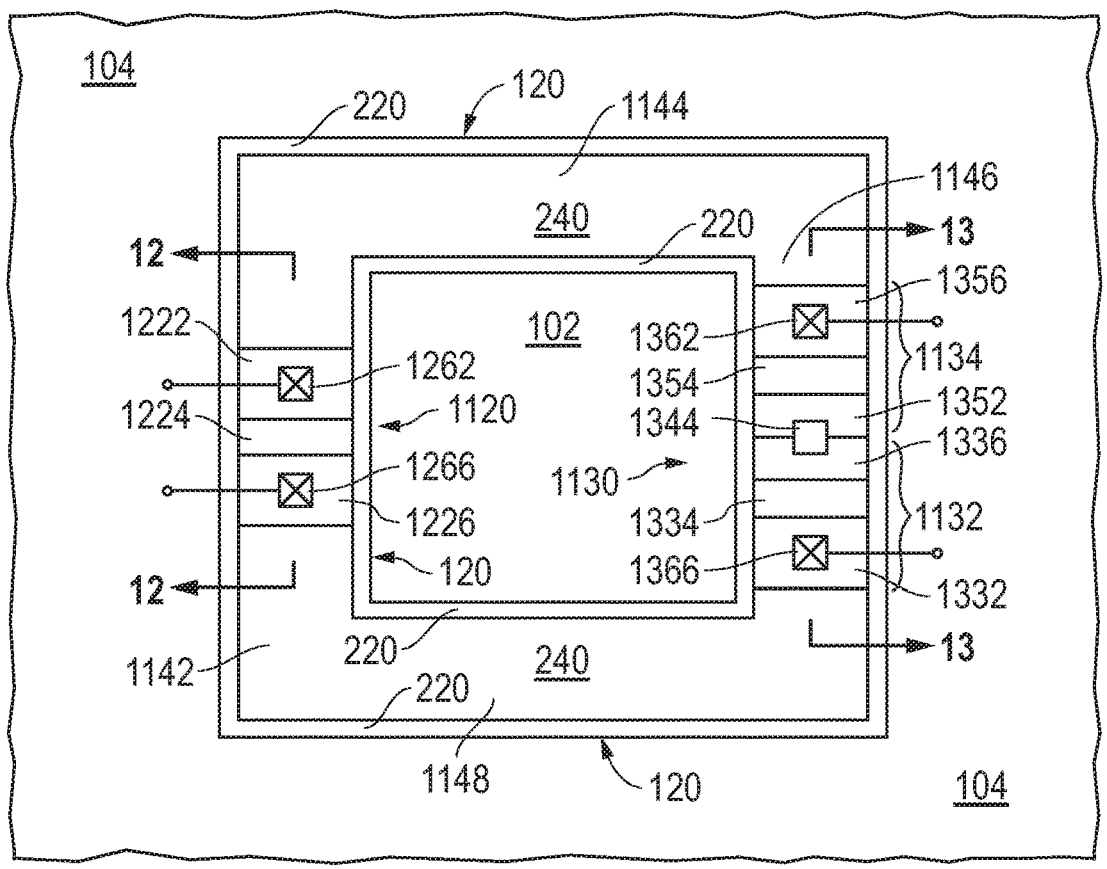
FIG. 11 includes an illustration of a top view of a portion the workpiece of FIGS. 3 and 4 after forming diodes in accordance with another embodiment.
Figure 12:
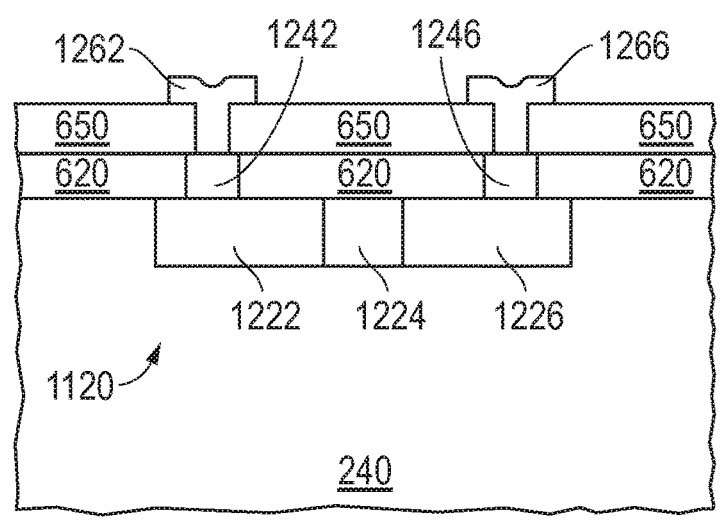
FIG. 12 includes an illustration of a cross-sectional view of a portion the workpiece of FIG. 11 that includes a diode in accordance with an embodiment.
Figure 13:
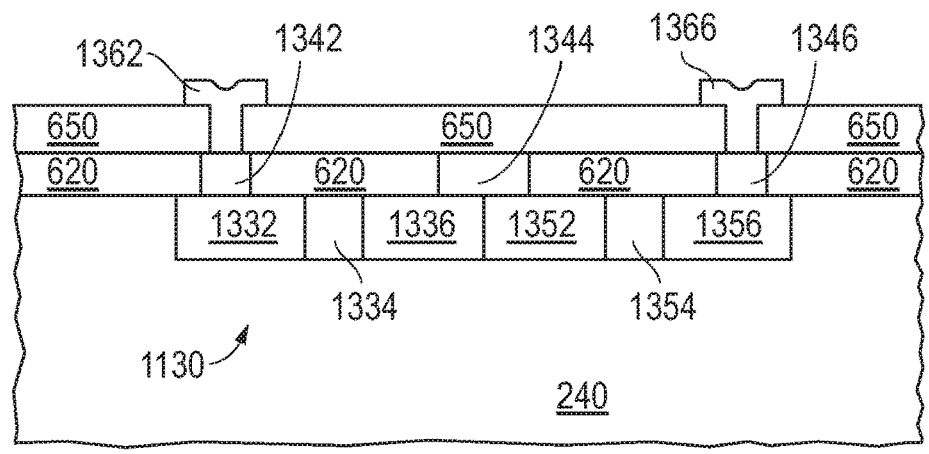
FIG. 13 includes an illustration of a cross-sectional view of a portion the workpiece of FIG. 11 that includes a set of diodes in accordance with an embodiment.

In other embodiments, one or more diodes may be formed within the semiconductor body 240. FIGS. 11 to 13 illustrate a top view and cross-sectional views of a diode 1120 and a set of diodes 1130 that can be formed within the semiconductor body 240. The illustrations in FIGS. 11 to 13 include an exemplary layout that is not meant to limit the scope of the present invention as defined in the appended claims. Referring to FIG. 11, the semiconductor body 240 includes a left-hand section 1142, a top section 1144, a right-hand section 1146, and a bottom section 1148. The semiconductor body 240 may contain only the diode 1120 or the set of diodes 1130 and not both, or may contain more than one of the diode 1120 or the set of diodes 1130. Further, the diode 1120 and set of diodes 1130 may be located within the same section of the semiconductor body 240, adjacent sections of the semiconductor body 240, or opposite sections (illustrated in FIG. 11) of the semiconductor body 240.

FIG. 12 includes the cross-sectional view of the diode 1120 along the sectioning line 12-12 in FIG. 11. The structure for the diode 1120 includes doped regions 1222, 1224, and 1226. The doped regions 1222 and 1226 have a relatively high dopant concentration that form ohmic contacts to salicide members 1242 and 1246 or the interconnects 1262 and 1266 if the optional salicide members 1242 and 1246 are not present. The doped region 1224 has a relatively lower dopant concentration as compared to the doped regions 1222 and 1226. The breakdown voltage of the diode 1120 can be determined by the dopant concentration of the doped region 1224, and to a lesser extent, the dopant concentration of the doped region having a conductivity type opposite that of the doped region 1224. In an embodiment, the doped region 1222 can be an N$^+$ region, the doped region 1224 can be an N$^-$ region, and the doped region 1226 can be a P$^+$ region. Thus, the breakdown voltage of the diode is determined by the dopant concentration of the doped region 1224, and to a lesser extent, the dopant concentration of the doped region 1226. If the doped region 1224 is a P$^-$ region, the breakdown voltage is determined by the dopant concentration of the doped region 1224, and to a lesser extent, the dopant concentration of the doped region 1222.

As illustrated, the doped regions 1222, 1224, and 1226 have substantially the same depth. In practice, any two or all of the doped regions 1222, 1224, and 1226 can have different depths. For example, the doped region 1222 can be formed at the same time as an N$^+$ source, drain, or emitter region, the doped region 1224 can be formed at the same time as an N$^-$ LDD region, and the doped region 1226 regions 1222, 1224, and 1226 can have different depths. For example, the doped region 1222 can be formed at the same time as an N$^+$ source, drain, or emitter region, and the doped region 1226 can be formed at the same time as a P$^+$ source, drain, or emitter region. In another embodiment, the doped region 1224 can be formed at the same time as a well or base region, an enhancement or depletion region of a channel region. Thus, the depth of the doped region 1224 can vary based in part on its formation with another doped region in an active region of the substrate 100. In another embodiment, the doped region 1224 may not be used. The semiconductor body 240 may lie between the doped regions 1222 and 1226. When the semiconductor body 240 is undoped, a P-type-Intrinsic-N-type (PIN) diode may be formed.

In a further embodiment, a Schottky diode may be formed in place of or in conjunction with the diode 1120. Either of the doped regions 1222 or 1226 may be removed, and the doped region 1224 directly contacts a salicide member or an interconnect if the salicide member is not present. In an embodiment, the doped region 1226 is removed and the doped region 1224 is extended to contact the salicide member 1246. In an embodiment, the doped regions 1222 and 1224 have the same conductivity type. The dopant concentration of the doped region 1222 is sufficiently high enough (e.g., at least $1 \times 10^{19}$ ohms/cm$^3$) to form an ohmic contact with the metal in the salicide member 1242, and the dopant concentration of the doped region 1224 is insufficient to form an ohmic contact with the metal in the salicide member 1246. In this embodiment, a Schottky diode is formed at the interface of the salicide member 1246 and the doped region 1224. In another embodiment, both a pn diode and a Schottky diode may be formed. The doped region 1222 is removed and the doped region 1224 is extended to contact the salicide member 1242. The doped regions 1224 and 1226 have opposite conductivity types, and thus, a pn diode is formed at the pn junction between the doped regions 1224 and 1226. Similar to a prior embodiment, the dopant concentration of the doped region 1224 is insufficient to form an ohmic contact with the salicide member 1242, and the dopant concentration of the doped region 1226 is sufficiently high enough (e.g., at least $1 \times 10^{19}$ ohms/cm$^3$) to form an ohmic contact with the salicide member 1246. In this embodiment, a Schottky diode is formed at the interface of the salicide member 1242 and the doped region 1224. In a further embodiment, the salicide members are not present, and the metal within the interconnects 1262 and 1266 form Schottky or ohmic contacts, just like the salicide members 1242 and 1246.

FIG. 13 includes the cross-sectional view of the set of diodes 1130, including the diodes 1132 and 1134. The diode 1132 includes doped regions 1332, 1334, and 1336, and the diode 1134 includes doped regions 1352, 1354, and 1356. The doped regions 1332 and 1352 are similar to and can be formed as described with respect to the doped region 1222, the doped regions 1334 and 1354 are similar to and can be formed as described with respect to the doped region 1224, and the doped regions 1336 and 1356 are similar to and can be formed as described with respect to the doped region 1226. The doped region 1332 is electrically connected to an interconnect 1362 via a salicide member 1342, and the doped region 1356 is electrically connected to an interconnect 1366 via a salicide member 1346. In an embodiment, the doped regions 1336 and 1352 have opposite conductivity types, and a salicide member 1344 electrically shorts the doped regions 1336 and 1352 together to electrically connect the diodes 1132 and 1134. If the salicide members 1342, 1344, and 1346 are not present, a contact opening in the insulating layer 650 can be formed over the doped regions 1336 and 1352, and another interconnect can be formed within the contact opening to electrically short the doped regions 1336 and 1352 together. More than two diodes can be serially connected. As the number of diodes increases, the breakdown voltage of the set of diodes 1130 increases, and the voltage needed to forward bias the diodes also increases. After reading this specification, skilled artisans will be able to design a set of diodes for a particular application.

Many different circuits can be used with the semiconductor body 240 providing at least one resistor or at least one diode for the circuits. In many of the figures that follow, interconnects will be illustrated with lines, so that the positional relationships between electronic components can be seen more clearly. In the top view illustrations, contacts are illustrated as Xs within boxes and interconnects are illustrated with lines. In practice, the interconnects may be at one or more different interconnect levels and may obscure portions of the electronic devices and their positional relationships to one another, which is why actual interconnects are not illustrated.

Figure 14:
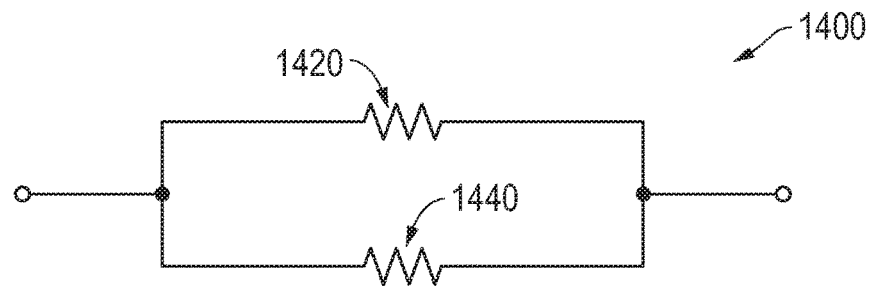
FIG. 14 includes a depiction of a circuit schematic of a resistor including a monocrystalline semiconductor material and another resistor including a polycrystalline semiconductor material.
Figure 15:
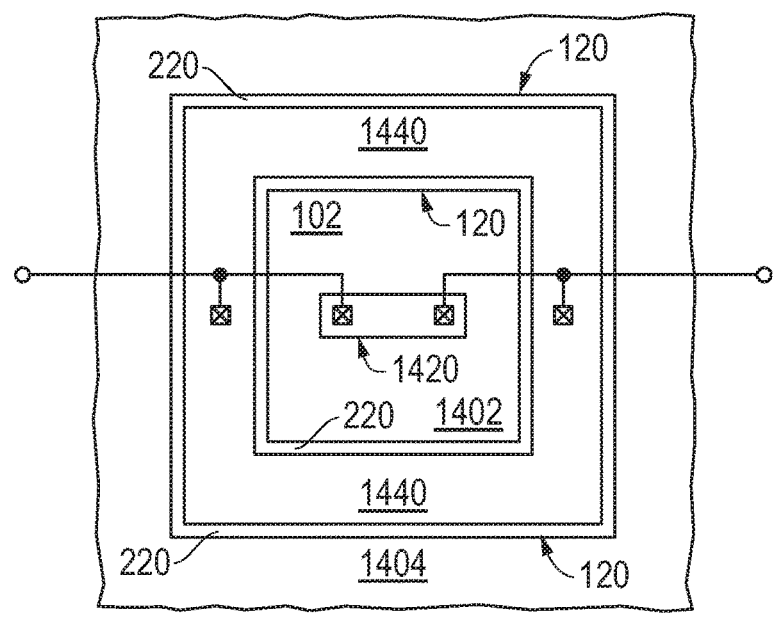
FIG. 15 includes an illustration of a physical design for the circuit schematic of FIG. 14 in accordance with an embodiment.

In a circuit 1400 illustrated in FIGS. 14 and 15, a pair of resistors 1420 and 1440 can be connected in parallel with the resistor 1420 in the active region 102 of the substrate 100 and the resistor 1440 within the semiconductor body 240 within the trench 120. Shallow trench isolation 1402 overlies portions of the substrate 100 outside electronic components within the active region 102 (not labeled in FIG. 15), and shallow trench isolation 1404 overlies portions of the substrate 100 outside electronic components within the active region 104 (not labeled in FIG. 15). In this embodiment, the resistor 1420 lies within a monocrystalline semiconductor material, and the resistor 1440 lies within a polycrystalline semiconductor material. The resistance of the resistor 1420 increases as the temperature increases, whereas the resistance of the resistor 1440 decreases as the temperature increases. Thus, the resistors 1420 and 1440 can be designed so that each resistor at least partly counteracts the other resistor as the temperature changes. In an embodiment at room temperature (e.g., in a range of 20° C. to 25° C.), the resistance of the resistor 1420 may be within 50% of the resistance of the resistor 1440. As the difference in resistances at a specific temperature (e.g., at room temperature) increase, the ability of the resistors 1420 and 1440 to compensate for each other may decrease.

Figure 16:
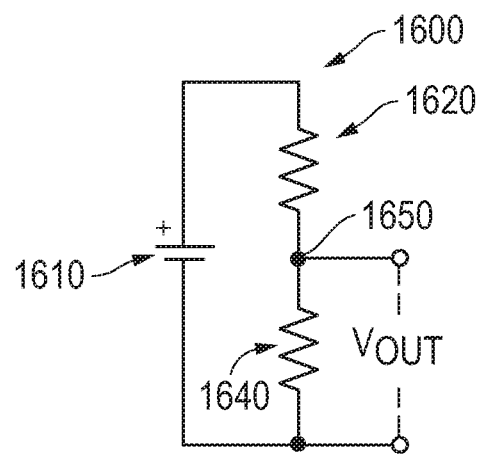
FIG. 16 includes a depiction of a circuit schematic of resistors that can be used in a temperature sensing circuit.
Figure 17:
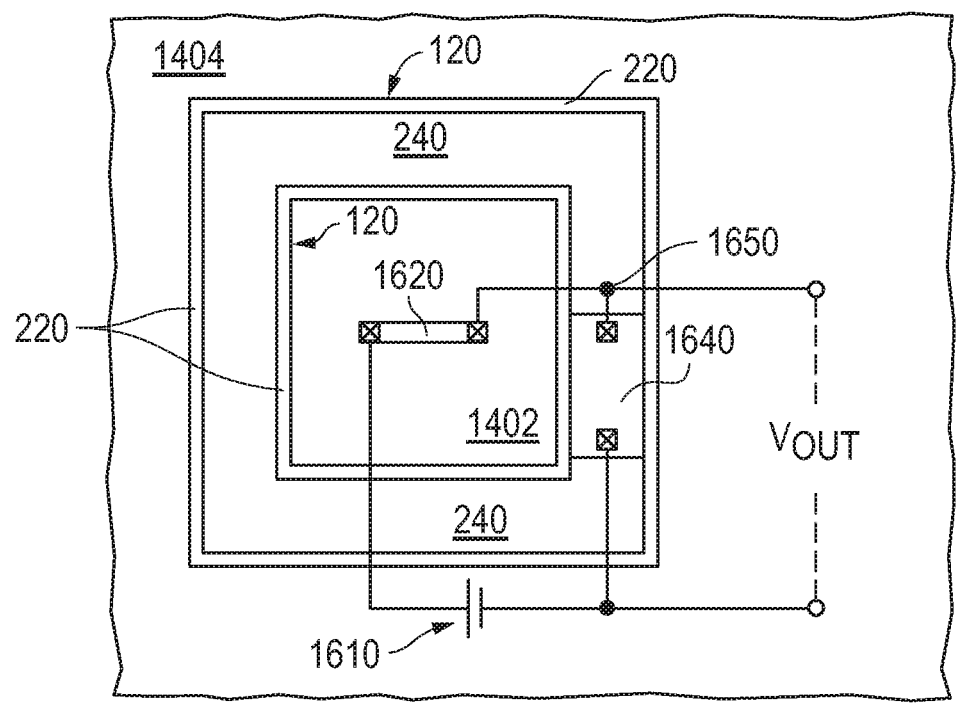
FIG. 17 includes an illustration of a physical design for the circuit schematic of FIG. 16 in accordance with an embodiment.

In another circuit 1600 illustrated in FIGS. 16 and 17, a similar pair of resistors 1620 and 1640 can be used as part of a temperature sensing circuit. A battery 1610 or other voltage source can be connected to terminals of the resistors 1620 and 1640. The other terminals of the resistors 1620 and 1640 are electrically connected at a node 1650. An output voltage ($V_{OUT}$) may be measured between the node 1650 and either of the terminals of the battery 1610 or other voltage source. As illustrated in FIG. 16, the $V_{OUT}$ is measured between negative terminal of the battery 1610 and the node 1650. Similar to the prior embodiment, the resistor 1620 is in the active region 102 of the substrate 100, and the resistor 1640 is within the semiconductor body 240 within the trench 120. In another embodiment, the positions of the resistors 1620 and 1640 may be reversed. Because a change in temperature has opposite effects on the resistance of the resistors 1620 and 1640, the circuit 1600 may be more sensitive to temperature changes as compared to a temperature sensing circuit that includes resistors only within the active region 102 or only within the semiconductor body 240. A plurality of temperature sensors may be used within an electronic device to provide a more complete temperature profile of the electronic device when the electronic device is in use.

Figure 18:
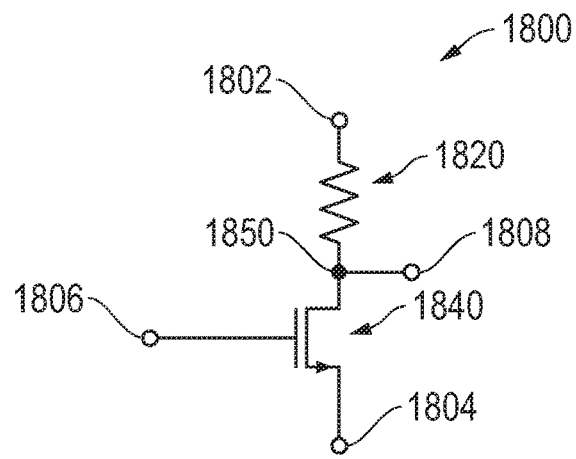
FIG. 18 includes a depiction of a circuit schematic of an inverter including a transistor and a resistor within a semiconductor body.
Figure 19:
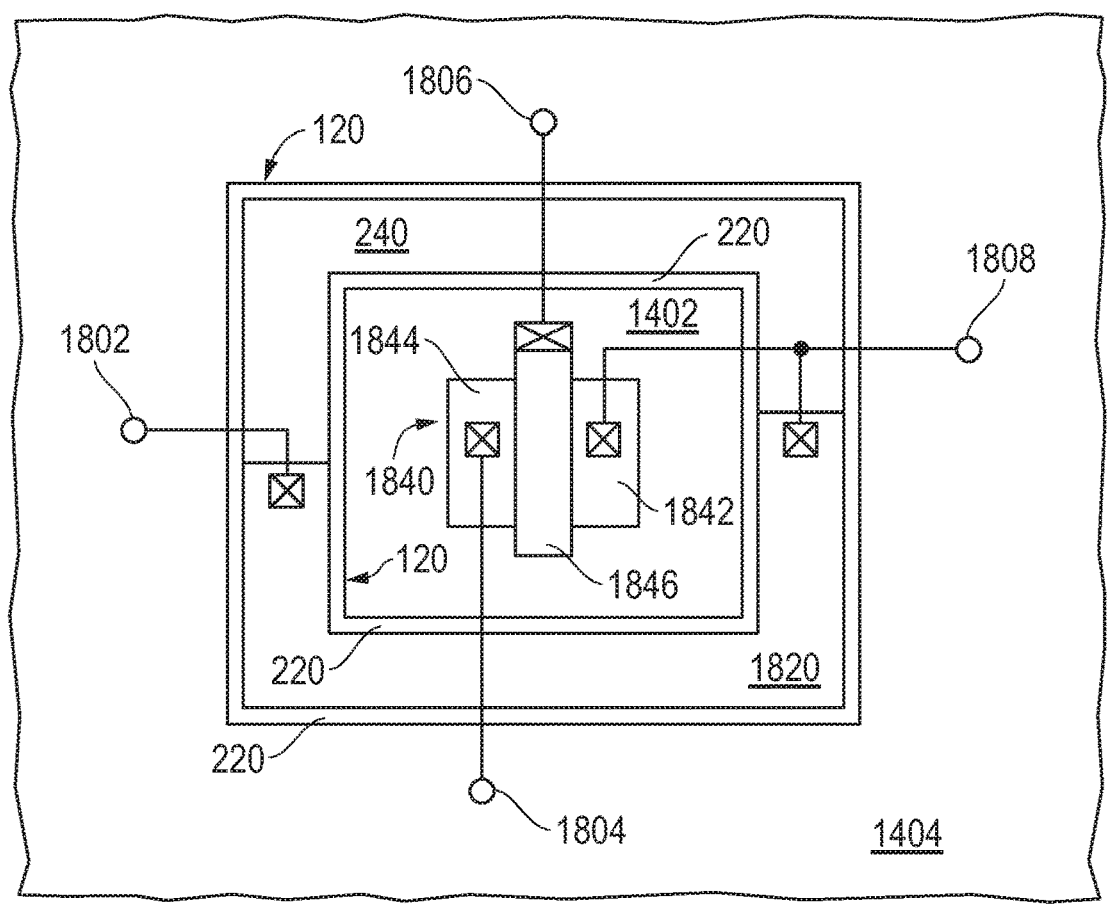
FIG. 19 includes an illustration of a physical design for the circuit schematic of FIG. 18 in accordance with an embodiment.

In a further circuit illustrated in FIGS. 18 and 19, an inverter 1800 can includes a resistor 1820 and a transistor 1840. A terminal of the resistor 1820 is coupled to a high voltage terminal 1802, and another terminal of the resistor 1820 is coupled to a current-carrying terminal of the transistor 1840 at a node 1850 that is coupled to an output terminal 1808. A control terminal of the transistor 1840 is coupled to an input terminal 1806, and another current-carrying terminal of the transistor 1840 is coupled to a low voltage terminal 1804. In an embodiment, the transistor 1840 is an enhancement-mode transistor. In the embodiment as illustrated, the transistor 1840 is an n-channel metalinsulator-semiconductor field-effect transistor (MISFET), the high voltage terminal 1802 is at $V_{DD}$ and is electrically connected to a terminal of the resistor 1820, and the low voltage terminal 1804 is at $V_{SS}$ and is electrically connected to a source electrode 1844 of the transistor 1840. The input terminal 1806 is electrically connected to a gate electrode 1846 of the transistor 1840, and the other terminal of the resistor 1820 and a drain electrode 1842 of the transistor 1840 are electrically connected to each other at the node 1850.

The resistor 1820 can be formed within semiconductor body 240. In an embodiment, the resistor 1820 can have a relatively high resistance, for example, greater than 0.1 Mohms, and typically in a range of 1 Mohms to 10 Mohms. The transistor 1840 can be formed within the active region 102 of the substrate 100. Interconnects at one or more interconnect levels can be used to connect the resistor 1820 and transistor 1840 to each other and to connect the electronic components to their corresponding terminals that can be connected to other portions of the electronic device outside of the inverter 1800.

Figure 20:
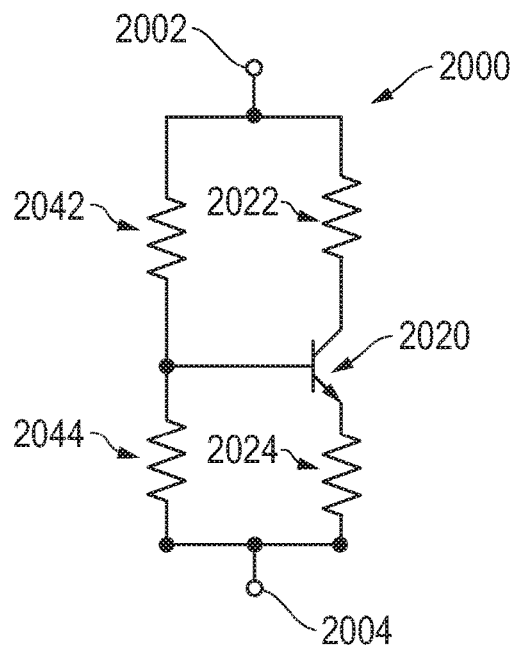
FIG. 20 includes a depiction of a circuit schematic of a bipolar transistor having its base connected to a voltage divider.
Figure 21:
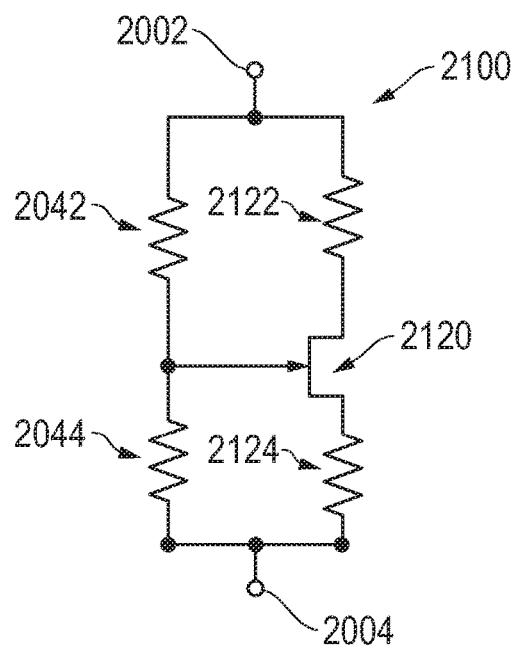
FIG. 21 includes a depiction of a circuit schematic of a junction field-effect transistor having its gate connected to a voltage divider.
Figure 22:
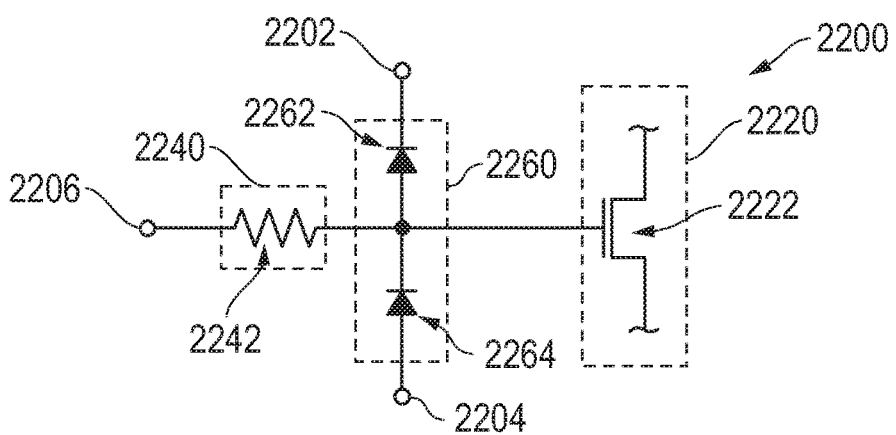
FIG. 22 includes a depiction of a circuit schematic of a metal-insulator-semiconductor field-effect transistor and electronic components to help protect the gate of the transistor.

FIGS. 20 and 21 include circuits that use a voltage divider in conjunction with a transistor. In FIG. 20, the circuit 2000 includes a bipolar transistor 2020 and resistors 2042 and 2044. The bipolar transistor 2020 has an associated collector resistance illustrated as a resistor 2022 and an associated emitter resistance illustrated as a resistor 2024. In the embodiment as illustrated, the transistor 2020 is an npn bipolar transistor. Terminals of the resistors 2022 and 2042 are coupled to a high voltage terminal 2002, another terminal of the resistor 2022, a terminal of the resistor 2042, and a base of the transistor 2020 are coupled to one another, and another terminal of the resistor 2044 and a terminal of the resistor 2024 are coupled to a low voltage terminal 2004. In a particular embodiment, the high voltage terminal 2002 can be at $V_{CC}$, and the low voltage terminal can be at $V_{EE}$. The circuit 2100 in FIG. 21 is similar except that the transistor 2020 and resistors 2022 and 2024 are replaced by a junction field-effect transistor 2120 having an associated drain resistance illustrated as a resistor 2122 and an associated source resistance illustrated as a resistor 2124. The high voltage terminal 2002 can be at $V_{DD}$, and the low voltage terminal can be at $V_{SS}$. The transistors 2020 and 2120 and their associated resistors 2022, 2024, 2122, and 2124 can be within an active region of the substrate 100, and one or both of the resistors 2042 and 2044 can be within the semiconductor body 240. In another embodiment, one of the resistors 2042 or 2044 may be within an active region of the substrate, and such active region may be the same or different active region for the transistor 2020 or 2120.

FIGS. 22 to 25 include illustrations of a more complicated circuit 2200 that allows for different layout options for the circuit 2200. The circuit 2200 includes a resistor 2242, diodes 2262 and 2264, and a transistor 2222. An input terminal 2206 is coupled to a terminal of the resistor 2242, and a high voltage terminal 2202 is coupled to a cathode of the diode 2262. Another terminal of the resistor 2242, an anode of the diode 2262, a cathode of the diode 2264, and a gate electrode of the transistor 2222 are coupled to one another. A low voltage terminal 2204 is coupled to an anode of the diode 2264. The current-carrying terminals of the transistor 2222 are coupled to other electronic components or terminals of the electronic device. In the embodiment as illustrated, the transistor 2222 is a MISFET, and in another embodiment (not illustrated) the transistor 2222 can be a bipolar transistor. The circuit 2200 is well suited for a high speed logic circuit (e.g., switching speed of at least 1 MHz).

Thus, the transistor 2222 can be a logic transistor. The resistor 2242 can help to limit current flowing to the gate electrode of the transistor 2222. The diodes 2262 and 2264 can help limit voltage seen at the gate electrode that may occur during a electrostatic discharge event, voltage overshoot at the input terminal 2206, or the like.

Figure 23:
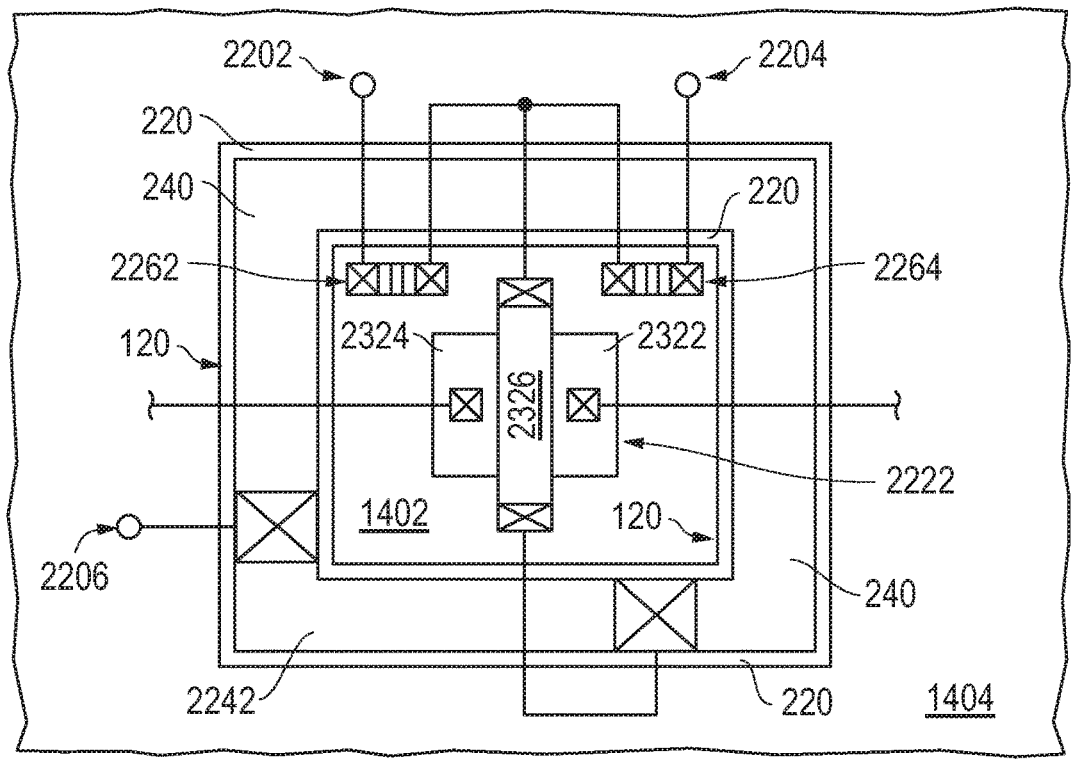
FIG. 23 includes an illustration of a physical design for the circuit schematic of FIG. 22 in accordance with an embodiment.
Figure 24:
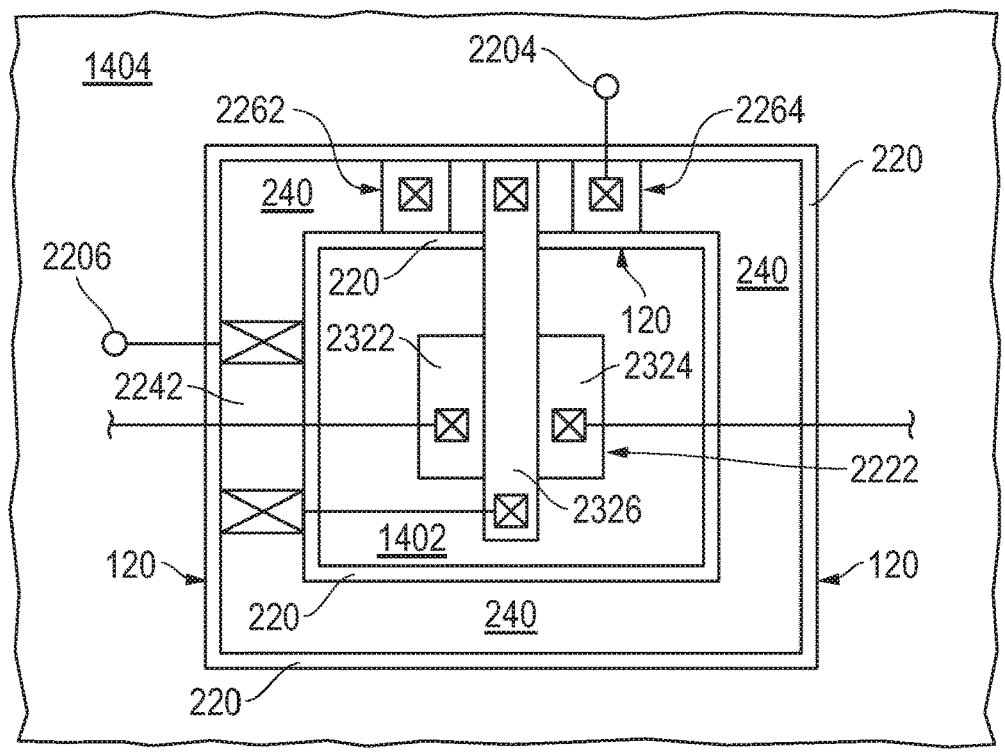
FIG. 24 includes an illustration of a physical design for the circuit schematic of FIG. 22 in accordance with another embodiment.
Figure 25:
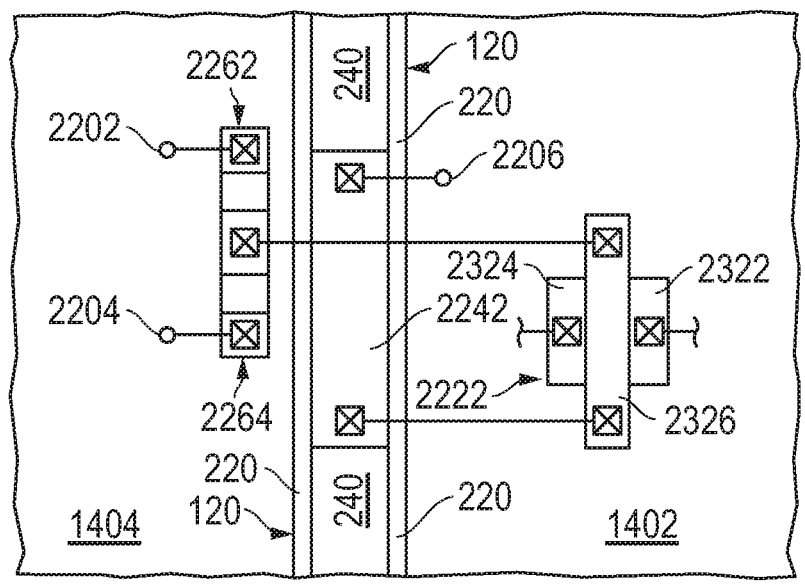
FIG. 25 includes an illustration of a physical design for the circuit schematic of FIG. 22 in accordance with a further embodiment.

The transistor 2222 is within a box 2220, the resistor 2242 is within a box 2240, and the diodes 2262 and 2264 are within a box 2260. The boxes 2220, 2240, and 2260 can correspond to different locations in different parts of the electronic device. The transistor 2222 (box 2220) can be located within an active region of substrate 100, the resistor 2242 (box 2240) may be located within the semiconductor body 240 or an active region of the substrate 100, and the diodes 2262 and 2264 (box 2260) may be located within the semiconductor body 240 or an active region of the substrate 100. As illustrated in FIGS. 23 to 25, a physical design of the circuit 2200 can be tailored to a particular application by placing the components within boxes in a variety of locations.

FIG. 23 includes a layout where electronic components of boxes 2220 and 2260 are within the same active area of the substrate and the electronic component of box 2240 is within the semiconductor body 240. The transistor 2222 and the diodes 2262 and 2264 are separated from one another by shallow trench isolation 1402. In another embodiment, the diodes 2262 and 2264 can have a layout similar to the set of diodes 1130 as illustrated in FIGS. 11 and 13. A drain region 2322 is coupled to another part of the electronic device, and a source region 2324 is coupled to a further part of the electronic device. In the embodiment as illustrated, one end of a gate electrode 2326 is electrically connected to an N+ region of the diode 2262 and to a P+ of the diode 2264, and the other end of the gate electrode 2326 is electrically connected to a terminal of the resistor 2242 that is within the semiconductor body 240. The other terminal of the resistor 2242 is coupled to the input terminal 2206. A P+ region of the diode 2262 is coupled to the high voltage terminal 2202, and an N+ region of the diode 2264 is coupled to the low voltage terminal 2204.

FIG. 24 includes a layout where electronic component of box 2220 is within an active region of the substrate and the electronic components of boxes 2240 and 2260 are within the semiconductor body 240. FIG. 24 is similar to FIG. 23 except that the diodes 2262 and 2264 are within a portion of the semiconductor body 240 that is spaced apart from the resistor 2242, and the shape of the resistor 2242 is changed. If needed or desired, the resistor 2242 can be within the active region 102 or 104, as opposed to being within the semiconductor body 240. Further, one of the diodes 2262 and 2264 can be within the semiconductor body 240, and the other of the diodes 2262 and 2264 can be within the active region 102 or 104. The gate electrode 2326 extends to the diodes 2262 and 2264 and can be electrically connected to anode of the diode 2262 and the cathode of the diode 2264 with a silicide member or interconnect.

FIG. 25 includes a layout where electronic components of boxes 2220 and 2260 are within the different active regions of the substrate and the electronic component of box 2240 is within the semiconductor body 240. In an embodiment, the different active regions lie along opposite sides of the trench 120 that includes the semiconductor body 240. In the embodiment as illustrated, the transistor 2222 is within active region 102 (not labelled in FIG. 25), and the diodes 2262 and 2264 are within the active region 104 (not labeled in FIG. 25) that lies along an opposite side of the deep trench isolation within the trench 120 as compared to the active region 102. On another embodiment, one of the diodes 2262 and 2264 can be within the active region 104, and the other of the diodes 2262 and 2264 can be within the active region 102. In a further embodiment, one of the diodes 2262 and 2264 can be within the semiconductor body 240, and the other of the diodes 2262 and 2264 can be within the active region 102 or 104.

After reading this specification, skilled artisans will understand that many other physical designs, including layouts, can be used to achieve the needs or desires for an application. The embodiments as illustrated in FIGS. 23 to 25 are meant to be exemplary and do not limit the scope of the present invention.

Figure 26:
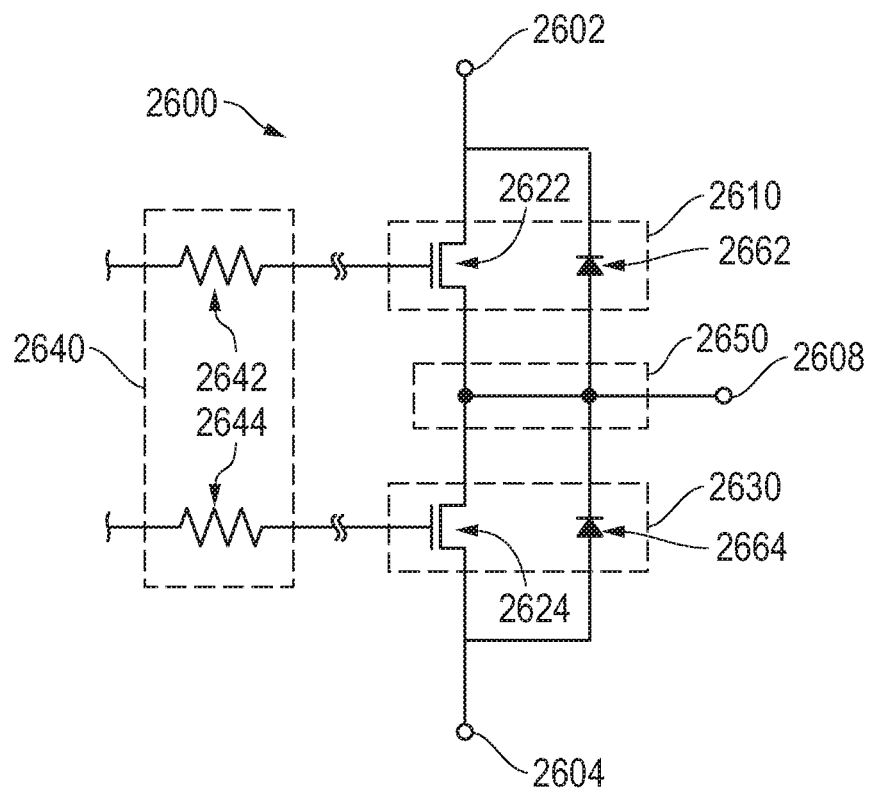
FIG. 26 includes a depiction of a circuit schematic of a switching circuit.
Figure 27:
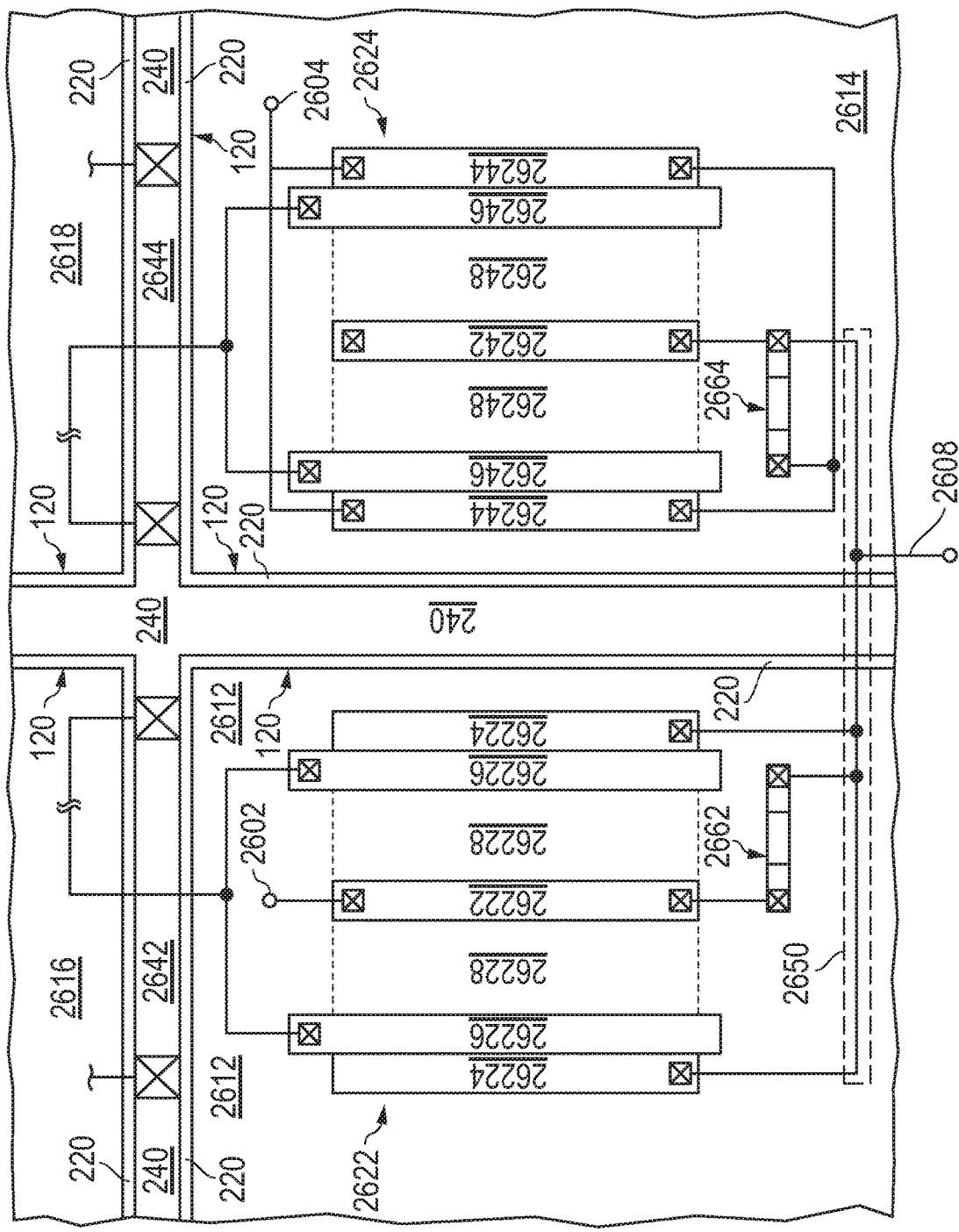
FIG. 27 includes an illustration of a physical design for the circuit schematic of FIG. 26 in accordance with an embodiment.

FIGS. 26 and 27 include a switching circuit 2600 that can be used as an energy converter, such as a Buck converter, a voltage regulator, or the like. The circuit 2600 includes a high-side transistor 2622, a low-side transistor 2624, diodes 2662 and 2664, and resistors 2642 and 2644. The circuit can also include other electronic components that are not illustrated, such as an inductor, a capacitor, or the like coupled to an output terminal 2608.

Referring to FIG. 26, the high-side transistor 2622 has a current-carrying terminal coupled to a high voltage terminal 2602, a control terminal of the transistor 2622 is coupled to a high-side control circuit that includes the resistor 2642, and another current-carrying terminal of the transistor 2622 is coupled to a current carrying terminal of the low-side transistor 2624 at a node 2650. A control terminal of the transistor 2624 is coupled to a low-side control circuit that includes the resistor 2644, and another current-carrying terminal of the transistor 2624 is coupled to a low voltage terminal 2604. In an embodiment, the transistors 2622 and 2624 are MISFETs, and in a particular embodiment, are n-channel MISFETs. The source of the high-side transistor 2622 is coupled to the drain of the low-side transistor 2624. The high-side control circuit can include a gate driver circuit for the transistor 2622, and the low-side control circuit can include a gate driver circuit for the transistor 2624. In a particular embodiment, each of the transistors 2622 and 2624 are power transistors.

The cathode of the diode 2662 is coupled to the high voltage terminal 2602, the anode of the diode 2662 and the cathode of the diode 2664 are coupled to the node 2650, and the anode of the diode 2664 is coupled to the low voltage terminal 2604. The diodes 2662 and 2664 can have breakdown voltages that are lower than the breakdown voltages between the current-carrying terminals (e.g., $BV_{DS}$) to protect the transistors 2622 and 2624 during voltage overshoot that may occur during a switching operation of the circuit 2600. The node 2650 is coupled to the output terminal 2608.

In FIG. 26, the transistor 2622 and the diode 2662 are within a box 2610, the transistor 2624 and the diode 2664 are within a box 2630, and the resistors 2642 and 2644 are within a box 2640. In an embodiment, the electronic components within the box 2610 are within an active region of the substrate 100, the resistors 2642 and 2644 (box 2640) are within the semiconductor body 240, the electronic components within the box 2630 are within a different active region of the substrate 100 or may be on a die separate from the remainder of the circuit 2600.

FIG. 27 includes an exemplary embodiment of the components within boxes 2610, 2630, and 2640. In this embodiment, each of the transistors and its corresponding diode are within the same active area, so that each diode provides good control of the voltage across its corresponding transistor to reduce the effects of voltage overshoot that can be in the form of ringing at the node 2650. The electronic components within boxes 2610 and 2630 lie along opposite sides of the trench 120. The resistors 2642 and 2644 within box 2640 can be within portions of the semiconductor body 240 within the trench 120.

As illustrated in FIG. 27, shallow trench isolation 2612, 2614, 2616, and 2618 overlie active regions of the substrate 100. For example, the shallow trench isolation 2612 can overlie the active region 102, the shallow trench isolation 2614 can over the active region 104, and the shallow trench isolation 2616 can over another active region, and the shallow trench isolation 2618 can over a further active region. Although not illustrated, other electronic components can be formed within any of the active regions. For example, other electronic components for the high-side control circuit can be within the active region 106, and other electronic components for the low-side control circuit can be within the active region 108.

In the embodiment as illustrated, the transistor 2622 includes source electrodes 26224, gate electrodes 26224, and a drain electrode 26226. Drift regions 26228 are illustrated with dashed lines, as the drift regions 26228 underlie the shallow trench isolation 2612. The diode 2662 is also located within the same active region as the transistor 2622. The drain electrode 26222 is illustrated as having connections to the high voltage terminal 2602 and a $P^+$ region of the diode 2662. The gate electrodes 26226 are connected to each other and are coupled to a terminal of the resistor 2642, and the other terminal of the resistor 2642 is coupled to another electronic component within the active region that underlies the shallow trench isolation 2616. The source electrodes 26224 are illustrated as having connections to an $N^+$ region of the diode 2662.

In the embodiment as illustrated, the transistor 2624 includes source electrodes 26244, gate electrodes 26246, and a drain electrode 26246. Drift regions 26248 are illustrated with dashed lines, as the drift regions 26248 underlie the shallow trench isolation 2614. The diode 2664 is also located within the same active region as the transistor 2624. The drain electrode 26242 is illustrated as having connections to an $P^+$ region of the diode 2664. The gate electrodes 26246 are connected to each other and are coupled to a terminal of the resistor 2644, and the other terminal of the resistor 2644 is coupled to another electronic component within the active region that underlies the shallow trench isolation 2618. The source electrodes 26244 are illustrated as having connections to the low voltage terminal 2604 and an $N^+$ region of the diode 2664.

The source electrodes 26224 of the high-side transistor 2622, the N+ region of the diode 2662, the drain electrode 26242 of the low-side transistor 2624, and the P+ region of the diode 2664 are coupled to one another at the node 2650. The node 2650 is coupled to the output terminal 2608. In the embodiment as illustrated, the node 2650 is electrically connected to the output terminal 2608. In another embodiment, a capacitor (not illustrated) can be coupled between the output node 2650 and the low voltage terminal 2604, and an inductor (not illustrated) can be coupled between the output node 2650 and the output terminal 2608. The capacitor and inductor can help to reduce ringing at the output node 2650 during switching operation and reduce the amount of a current surge to a load (not illustrated) coupled between the output terminal 2608 and the low voltage terminal 2604.

Many other physical designs can be used for the circuit FIG. 26 beyond the one illustrated in FIG. 27. For example, one or both of the diodes 2662 and 2664 can be formed within the semiconductor body 240. One or both of the resistors 2642 and 2644 can be forming in the same active region corresponding to shallow trench isolation 2616 or 2618. In a further embodiment, a semiconductor die can include the high-side transistor 2622 and its corresponding control circuit, and another semiconductor die can include the low-side transistor 2624 and its corresponding control circuit. Still further physical designs are possible.

After reading this specification, skilled artisans will appreciate that physical designs, including layouts as illustrated, are simplified. In practice, more complicated and densely packed components can be implemented using the concepts described herein. Further, power transistors may have many more contacts as illustrated to allow sufficient current to flow through such power transistors.

Embodiments as described herein can be used to form resistors and diodes within a semiconductor body that would otherwise not include any electronic components. The semiconductor body can be part of a semiconductor material that fills a trench that is part of a deep trench isolation structure. The semiconductor body can be isolated from adjacent active regions by an insulating layer, and thus, the semiconductor body may include one or more electronic components that are coupled to electronic components within the active regions on either or both sides of the deep isolation trench. The process of forming the electronic components within the semiconductor body can be integrated with an existing process flow when forming doped regions for electronic components in the active regions. Accordingly, no additional masking operation or process step is required.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device can include a substrate defining trench having a depth of at least 5 microns; a semiconductor body within the trench, wherein the semiconductor body has an upper surface and a resistivity of at least 0.05 ohm-cm and is electrically isolated from the substrate; and a first electronic component within and along an upper surface of the semiconductor body, wherein the first electronic component is spaced apart from a bottom of the semiconductor body.

Embodiment 2

The electronic device of Embodiment 1, further including an insulating layer disposed between the semiconductor body and a sidewall and bottom of the trench.

Embodiment 3

The electronic device of Embodiment 1, wherein the substrate includes a monocrystalline semiconductor material, and the semiconductor body includes a polycrystalline semiconductor material.

Embodiment 4

The electronic device of Embodiment 1, wherein the first electronic component includes a first doped region within the semiconductor body, wherein the first doped region has dopant concentration higher than a background dopant concentration of the semiconductor body, and portions of the semiconductor body outside of the first doped region lie vertically below and laterally beside the first doped region.

Embodiment 5

The electronic device of Embodiment 4, wherein the first electronic component is a diode and further includes a second doped region having an opposite conductivity type as compared to the first doped region.

Embodiment 6

The electronic device of Embodiment 4, wherein the first electronic component is a resistor including the first doped region that is a well region extending to a depth that is less than half the depth of the trench.

Embodiment 7

The electronic device of Embodiment 1, further including a first doped region and a second doped region spaced apart from the first doped region, wherein the first and second doped regions have a same conductivity type, each of the first and second doped regions has a dopant concentration higher than a dopant concentration of the semiconductor body, and a portion of the semiconductor body having the resistivity of at least 0.05 ohm-cm is disposed between the first and second doped regions.

Embodiment 8

An electronic device can include a substrate defining a trench;
a first electronic component within a first active region of the substrate; an isolation structure within the trench and surrounding the first electronic component; and a second electronic component within the isolation structure.

Embodiment 9

The electronic device of Embodiment 8, wherein the isolation structure includes a semiconductor body including at least a portion that underlies the second electronic component; and an insulating layer lying along a side and bottom of the trench and electrically isolating the semiconductor body from the substrate.

Embodiment 10

The electronic device of Embodiment 9, wherein the first active region includes a monocrystalline semiconductor material, and the semiconductor body and the second electronic component includes a polycrystalline semiconductor material.

Embodiment 11

The electronic device of Embodiment 8, further including a third electronic component within a second active region of the substrate, wherein the isolation structure is disposed between the first and third electronic components.

Embodiment 12

The electronic device of Embodiment 8, wherein:
the first electronic component is a power transistor or a logic transistor, and
the third electronic component is the other of the power transistor or the logic transistor.

Embodiment 13

The electronic device of Embodiment 12, wherein the power transistor includes a metal-insulator-semiconductor field-effect transistor, an insulated gate bipolar transistor, or a junction bipolar transistor.

Embodiment 14

The electronic device of Embodiment 8, wherein the first electronic component is a transistor, and the second electronic component is a resistor coupled to the transistor.

Embodiment 15

The electronic device of Embodiment 8, wherein the first electronic component is a transistor, and the second electronic component is a diode coupled to the transistor.

Embodiment 16

The electronic device of Embodiment 8, wherein the first electronic component is a first resistor, the second electronic component is a second resistor, and the first and second resistors are connected in parallel.

Embodiment 17

The electronic device of Embodiment 16, wherein the first resistor has a body that includes a monocrystalline semiconductor material, and the second resistor has a body that includes a polycrystalline semiconductor material.

Embodiment 18

An electronic device can include a substrate defining trench; a semiconductor body within the trench, wherein the semiconductor body has a resistivity of at least 0.05 ohm-cm and is electrically isolated from the substrate; and a diode within the semiconductor body.

Embodiment 19

The electronic device of Embodiment 18, wherein the semiconductor body and the diode include a polycrystalline semiconductor material.

Embodiment 20

The electronic device of Embodiment 19, further including a first electronic component and a second electronic component, wherein an isolation structure includes the semiconductor body and an insulating layer that electrically isolates the semiconductor body from the substrate, the first electronic component is along a first side of the isolation structure, the second electronic component is along a second side of the isolation structure opposite the first side, and the first electronic component, the second electronic component, or each of the first and second electronic components is coupled to the diode.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a substrate defining a trench having a depth of at least 5 microns;
   a semiconductor body within the trench, wherein the semiconductor body has an upper surface and a resistivity of at least 0.05 ohm-cm and is electrically isolated from the substrate; and
   a first electronic component within and along the upper surface of the semiconductor body, wherein the first electronic component is spaced apart from a bottom of the semiconductor body.

2. The electronic device of claim 1, further comprising an insulating layer disposed between the semiconductor body and a sidewall and bottom of the trench.

3. The electronic device of claim 1, wherein the substrate includes a monocrystalline semiconductor material, and the semiconductor body includes a polycrystalline semiconductor material.

4. The electronic device of claim 1, wherein the first electronic component comprises a first doped region within the semiconductor body, wherein the first doped region has a concentration higher than a background concentration of the semiconductor body, and portions of the semiconductor body outside of the first doped region lie vertically below and laterally beside the first doped region.

5. The electronic device of claim 4, wherein the first electronic component is a diode and further comprises a second doped region having an opposite conductivity type as compared to the first doped region.

6. The electronic device of claim 4, wherein the first electronic component is a resistor including the first doped region that is a well region extending to a depth that is less than half the depth of the trench.

7. The electronic device of claim 1, further comprising a first doped region and a second doped region spaced apart from the first doped region, wherein the first and second doped regions have a same conductivity type, each of the first and second doped regions has a concentration higher than the semiconductor body, and a portion of the semiconductor body having the resistivity of at least 0.05 ohm-cm is disposed between the first and second doped regions.

8. An electronic device comprising:
a substrate defining a trench;
a first electronic component within a first active region of the substrate;
an isolation structure within the trench and surrounding the first electronic component,
wherein the isolation structure comprises:
a semiconductor body within the trench; and
an insulating layer lying along a side and a bottom of the trench and electrically isolating the semiconductor body from the substrate; and
a second electronic component within the trench, wherein at least a portion of the semiconductor body within the trench underlies the second electronic component.

9. The electronic device of claim 8, wherein the first active region includes a monocrystalline semiconductor material, and the semiconductor body and all of the second electronic component includes a polycrystalline semiconductor material.

10. The electronic device of claim 8, further comprising a third electronic component within a second active region of the substrate, wherein the isolation structure is disposed between the first and third electronic components.

11. The electronic device of claim 8, wherein:
the first electronic component is a power transistor or a logic transistor, and
the third electronic component is the other of the power transistor or the logic transistor.

12. The electronic device of claim 11, wherein the power transistor includes a metal-insulator-semiconductor field-effect transistor, an insulated gate bipolar transistor, or a junction bipolar transistor.

13. The electronic device of claim 8, wherein the first electronic component is a transistor, and the second electronic component is a resistor coupled to the transistor.

14. The electronic device of claim 8, wherein the first electronic component is a transistor, and the second electronic component is a diode coupled to the transistor.

15. The electronic device of claim 8, wherein the first electronic component is a first resistor, the second electronic component is a second resistor, and the first and second resistors are connected in parallel.

16. The electronic device of claim 15, wherein the first resistor has a body that includes a monocrystalline semiconductor material, and the second resistor has a body that includes a polycrystalline semiconductor material.

17. The electronic device of claim 8, wherein the second electronic component is a resistor.

18. An electronic device comprising:
a substrate defining a trench;
a semiconductor body within the trench, wherein the semiconductor body has a resistivity of at least 0.05 ohm-cm and is electrically isolated from the substrate; and
a diode within the semiconductor body.

19. The electronic device of claim 18, wherein the semiconductor body and the diode include a polycrystalline semiconductor material.

20. The electronic device of claim 19, further comprising a first electronic component and a second electronic component, wherein:
an isolation structure includes the semiconductor body and an insulating layer that electrically isolates the semiconductor body from the substrate,
the first electronic component is along a first side of the isolation structure,
the second electronic component is along a second side of the isolation structure opposite the first side, and
the first electronic component, the second electronic component, or each of the first and second electronic components is coupled to the diode.

* * * * *